United States Patent
Tanaka et al.

(10) Patent No.: US 6,974,972 B1
(45) Date of Patent: Dec. 13, 2005

(54) THIN-FILM TRANSISTOR, AND LIQUID CRYSTAL DISPLAY DEVICE USING THE SAME

(75) Inventors: Hironori Tanaka, Takatsuki (JP); Hiroshi Tsutsu, Osaka (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 350 days.

(21) Appl. No.: 10/111,005

(22) PCT Filed: Oct. 19, 2000

(86) PCT No.: PCT/JP00/07306

§ 371 (c)(1), (2), (4) Date: Apr. 19, 2002

(87) PCT Pub. No.: WO01/29898

PCT Pub. Date: Apr. 26, 2001

(30) Foreign Application Priority Data

Oct. 21, 1999 (JP) ................... 11/299656

(51) Int. Cl.[7] ........................................... H01L 29/15
(52) U.S. Cl. ........................................ 257/72; 257/59
(58) Field of Search ..................... 257/59, 72

(56) References Cited

U.S. PATENT DOCUMENTS

| | | | |
|---|---|---|---|
| 5,292,675 A * | 3/1994 | Codama | 438/163 |
| 5,741,718 A * | 4/1998 | Codama et al. | 438/286 |
| 5,767,531 A * | 6/1998 | Yoshinouchi | 257/72 |
| 5,905,286 A | 5/1999 | Iwamatsu et al. | 257/347 |
| 5,965,916 A * | 10/1999 | Chen | 257/347 |
| 6,218,678 B1 * | 4/2001 | Zhang et al. | 257/59 |
| 2004/0051101 A1 * | 3/2004 | Hotta et al. | 257/72 |

FOREIGN PATENT DOCUMENTS

| | | | |
|---|---|---|---|
| JP | 2-196470 | * | 8/1990 |
| JP | 03-009531 | | 1/1991 |
| JP | 03-020048 | | 1/1991 |
| JP | 06-291314 | | 10/1994 |
| JP | 06-342808 | | 12/1994 |
| JP | 09-082973 | | 3/1997 |
| JP | 10-070267 | | 3/1998 |
| JP | 10-125928 | | 5/1998 |
| JP | 11-121757 | | 4/1999 |
| JP | 11-163353 | * | 6/1999 |
| JP | 11-271792 | | 10/1999 |

* cited by examiner

*Primary Examiner*—Nathan J. Flynn
*Assistant Examiner*—Ahmed J. Sefer
(74) *Attorney, Agent, or Firm*—Steptoe & Johnson LLP

(57) ABSTRACT

In a large-sized substrate for use in liquid crystal display devices, microcracks in a gate insulating film are prevented from being generated, whereby warpage of the substrate is suppressed. In order to solve the problems, in thin film transistors arrayed on a glass substrate, the gate insulating film is made thicker only in the portion that is directly under a gate line layer.

12 Claims, 10 Drawing Sheets

PRIOR ART

Fig. 4
Fig. 4(1)
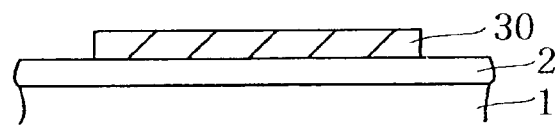
Fig. 4(2)
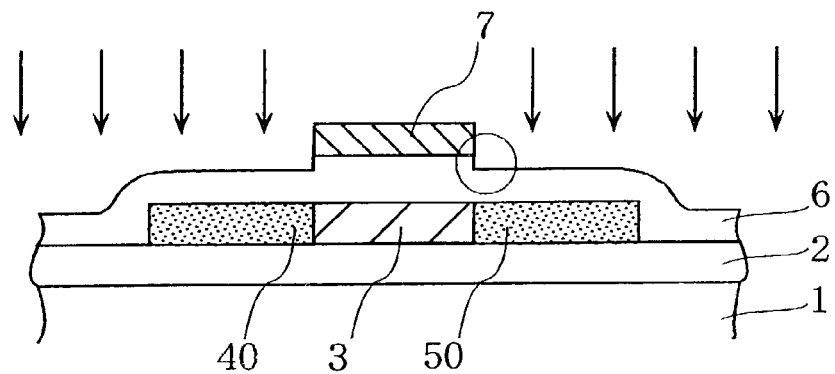
Fig. 4(3)
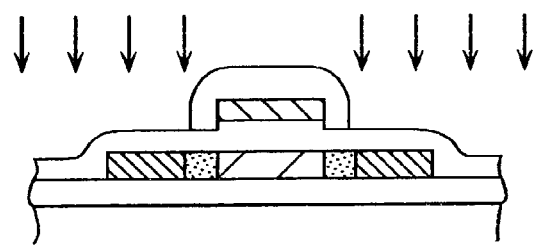
Fig. 4(4)
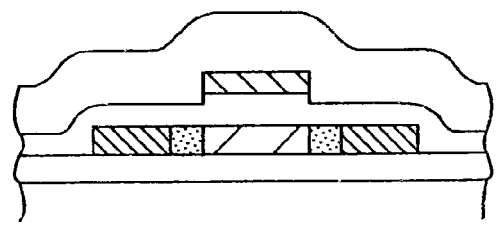
Fig. 4(5)
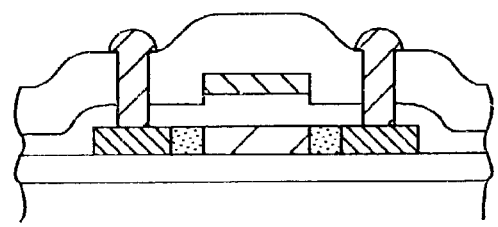

THIN-FILM TRANSISTOR, AND LIQUID CRYSTAL DISPLAY DEVICE USING THE SAME

TECHNICAL FIELD

The present invention relates to a thin film transistor, and more particularly to the structure of a top gated thin film transistor and a liquid crystal device using the transistor as a switching element.

BACKGROUND ART

General Background Art of the Present Invention

Conventionally, top gated thin film transistors (TFTs) in which polysilicon is used as a semiconductor have typically been used for semiconductor devices, especially for pixel switching elements for use in liquid crystal display devices.

A cross-sectional view of a conventional top gated thin film transistor for use in a semiconductor device is shown in FIG. 1. This thin film transistor, although being a prior art device, will be described below with reference to FIG. 1 since this thin film transistor is related to the present invention.

In FIG. 1, reference numeral 1 denotes a glass substrate. Reference numeral 2 denotes an undercoat layer formed over the upper surface of the glass substrate. Reference numeral 3 denotes a polysilicon layer that is formed over the upper surface of the undercoat layer at a prescribed position and forms a channel region in a semiconductor layer. Reference numeral 4 denotes a polysilicon layer which likewise forms a source region. Reference numeral 5 denotes a polysilicon layer which likewise forms a drain region. Reference numerals 34 and 35 denote polysilicon layers which likewise form LDD (Lightly Doped Drain) regions. Reference numeral 6 denotes a gate insulating film. Reference numeral 7 denotes a gate line layer positioned above the polysilicon layer which forms the channel region with the gate insulating film interposed therebetween. Reference numeral 8 denotes an interlayer insulating film. Reference numerals 94 and 95 denote a source wiring layer and a drain wiring layer, respectively, that are connected to the source region and the drain region through contact holes formed in the portions corresponding to the source region and the drain region.

A thin film transistor having such a structure in which polysilicon is used has a high mobility of several ten to several hundred cm$^2$/Vs. Therefore, the thin film transistor is widely used for a switching element of a pixel area and as an element in a driving circuit in an active matrix liquid crystal display device.

For a switching element in the pixel area, an n-type polysilicon thin film transistor is generally used, but it shows a large leakage current as it is. In view of this, the LDD regions 34 and 35 having a very small impurity concentration are interposed between the polysilicon layer that forms the channel region and the source and drain regions, which are disposed on opposing sides thereof so that the electric fields at the end portions of the source and drain regions are relaxed and the leakage current is reduced.

Well-known or widely used methods of fabricating a polysilicon thin film include a laser annealing technique in which after (or before) an amorphous silicon layer formed over the undercoat layer is separated (patterned) according to the arrangement of transistor elements on the substrate, the amorphous layer is made to temporarily melt by irradiation with an excimer laser and then is polycrystallized at the time of the solidification and a technique in which an amorphous silicon having an epitaxial growth-promoting agent previously mixed therein is heated to undergo solid-phase growth.

In addition, known methods of forming a source region and a drain region include a technique in which impurities such as phosphorus ions are implanted and then activation is performed using a laser or heat, a self-activated technique in which the effects of hydrogen that is injected for the purpose of dilution at the same time as the ion implantation are exercised, and the like.

The previously-mentioned method that employs a laser for forming a polysilicon layer and for activating a source and drain regions is a process that can be performed at low temperatures and can employ an inexpensive glass substrate. Therefore, this method is extremely useful for mass production of liquid crystal display devices.

In addition, a method that employs a non-mass separation ion doping and a self-activating technique utilizing the advantages thereof for the formation of the source and drain regions is suitable for a process which uses large-sized substrates, and therefore is contemplated as suitable for mass production.

Next, the manner of the process for forming a top gated polysilicon thin film transistor on a substrate using a laser annealing technique and a self-activating technique will be described with reference to FIG. 2.

The present FIG. 2 is a cross-sectional view showing how a semiconductor device, especially a transistor, shown in FIG. 1, is formed with the progress of the manufacturing process.

(1) An undercoat layer 2 of a SiO$_2$ film is formed into a thickness of 600 nm over the upper surface of a glass substrate and an amorphous Si film is formed thereon into a thickness of 50 nm, and then this amorphous Si film is polycrystallized by laser annealing and is patterned into a so-called island-like shape (so as to be separated). (Note that laser annealing may be performed after the patterning of the amorphous Si film. The patterning is generally performed using photolithography and etching.)

(2) A SiO$_2$ film 6 having a thickness of 100 nm is formed over the island-like polysilicon film as a gate insulating film. A gate insulating layer is formed thereon into a thickness of 250 nm and is patterned so as to leave a gate line layer only above a portion that forms a channel region in the semiconductor layer made of the polysilicon film. Subsequently, using the remaining gate line layer as an implantation mask, doping (n$^-$doping) with a small dose of phosphorus ions is carried out from a direction above the substrate so that the polysilicon layer, except a region that is directly below the gate line layer, is made to have the same impurity concentration as LDD regions.

(3) An implantation mask 10 is formed of a resist such that the implantation mask extends off the opposing sides of the gate line layer by about 15% of the gate line layer width in the direction of the channel. Doping (n$^+$doping) with a large dose of phosphorus ions is carried out from a direction above the substrate, so that in the polysilicon film, regions directly below the resist mask are made LDD regions while regions lying on opposing sides of the LDD regions that are doped with a large dose of phosphorus ions are made a source region and a drain region.

(4) The resist mask is removed and an interlayer insulating film 8 is formed over the entire structure, and then activation is performed for about one hour at 500° C.

(4) Contact holes are formed through portions of the interlayer insulating film and the gate insulating film that correspond to the source region 4 and the drain region 5, and by filling the insides thereof with a metal, a source wiring layer 94 and a drain wiring layer 95 are formed.

With the above process, a thin film transistor (TFT) using polysilicon is completed.

It should be noted that in reality, thin film transistors like those shown in the drawings formed on the substrate are arranged in a plurality of rows and columns so as to correspond to pixels or driving circuits of a display unit, or the substrate itself is arranged in a plurality of layers depending on circumstances, and these necessitate the formation of signal lines and the like for connecting a plurality of thin film transistors; however, since these are known in the art, illustrations and explanations are omitted.

Background Art in View of the Problems that the Present Invention is Going to Solve In a semiconductor device or a thin film transistor made of polysilicon as a primary portion thereof that is fabricated in such a manner, when a $SiO_2$ film is used as the gate insulating film, the film thickness needs to be large enough to ensure a withstand voltage required for transistor operation between the gate insulating film and the source and drain regions. However, since the stress to the $SiO_2$ film increases, microcracks are likely to be developed at the time of beat treatments such as annealing and forcing out hydrogen after the formation of the film. Moreover, in the case of a large-sized substrate in which each side is 30 cm or more, the stress to the $SiO_2$ film causes the substrate to be warped, and thereby problems are likely to arise in transport in manufacturing equipment, vacuum holding for transportation and positioning, and the like.

When a SiN film or a multilayer film including a SiN film is used as the gate insulating film, the thickness itself of the gate insulating film that is necessary to ensure a withstand voltage required for transistor operation can be smaller in comparison with the case of $SiO_2$. However, the stress to the SiN film is greater than that in the case of a $SiO_2$ film, creating a similar problem. (For reference, the thermal expansion coefficient of SiN is approximately the negative 6th power of 2.8 to $3.2\times10/°$ C., and that of glass is the negative 6th power of $3.8\times10/°$ C.)

Especially, in view of the recent trend toward larger-sized display screens of display devices, substrate size has also increased, and therefore solutions for these problems have been desired.

Aside from the foregoing, there has been a similar problem for an underlying insulating film on the glass substrate. Since this problem is discussed in detail in Japanese Unexamined Patent Publication No. 11-163353, explanations are omitted.

In addition, with the trend toward larger-sized substrates, there is a similar need in a bottom gated thin film transistor.

DISCLOSURE OF THE INVENTION

It is an object of the present invention to solve the foregoing problems, and the gate insulating film and the underlying insulating film are formed to have a normal thickness only in a limited region. More details are discussed below.

In a first aspect of the present invention, the thickness of only a region of a gate insulating film that is directly below a gate line layer (including a gate electrode and the line connected thereto) is made large.

In addition, a characteristic feature lies in the thickness difference between the region that is directly below the gate line layer and the rest of the gate insulating film.

Furthermore, another characteristic feature lies in the method of forming the thickness difference between the region that is directly below the gate line layer and the rest of the gate insulating film.

Moreover, the underling insulating film is such that even a portion of the underlying film that extends slightly off the semiconductor layer has a thickness large enough to completely prevent ions and the like from entering from the glass at the time of heating.

Also, a similar technique is employed for bottom gated transistors.

BRIEF DESCRIPTION OF THE DRAWINGS

FIG. 4 is a view showing a manufacturing process of the above-mentioned thin film transistor.

Figure 1:
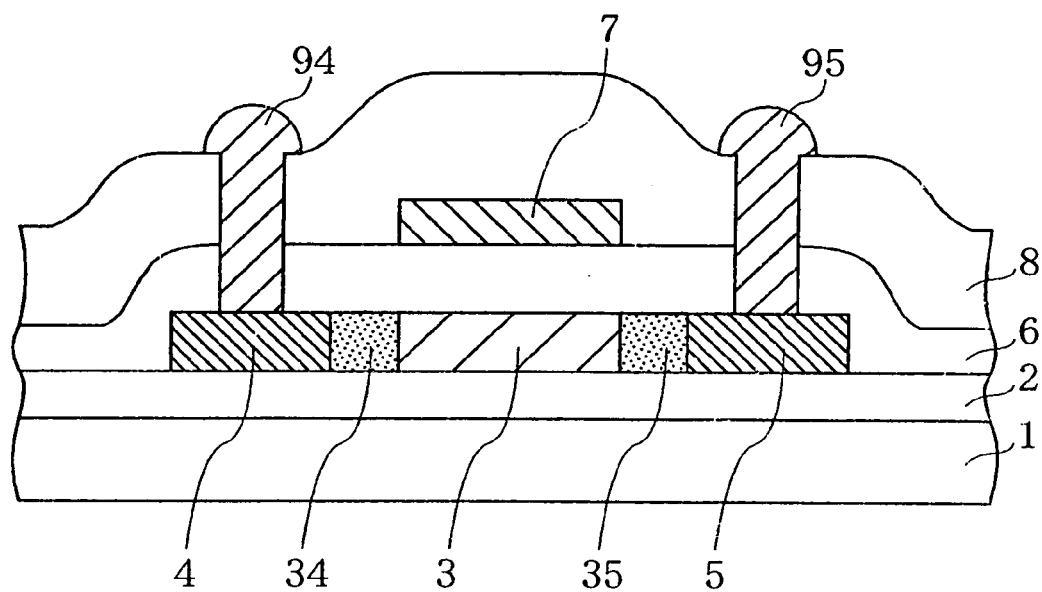
FIG. 1 is a cross-sectional view of a prior-art semiconductor device, specifically, a thin film transistor.

DESCRIPTION OF THE REFERENCE NUMBERS 1 glass substrate
2 undercoat (underlying insulating film) layer
3 polysilicon layer which forms a channel region, entire polysilicon layer
30 island-shaped polysilicon layer
34 polysilicon layer which forms an LDD region on the source side
35 polysilicon layer which forms an LDD region on the drain side
4 polysilicon layer which forms a source region
5 polysilicon layer which forms a drain region
6 gate insulating layer
7 gate line layer (electrode)
8 interlayer insulating film
94 source wiring layer
95 drain wiring layer
10 resist mask
33 passivation film
34 counter electrode
35 counter substrate
36 liquid crystal material
37 offset region
42 extraction electrode
43 light-emitting material

BEST MODE FOR CARRYING OUT THE PRESENT INVENTION

The present invention will be described below referring to preferred embodiments.

Embodiment 1

Figure 3:
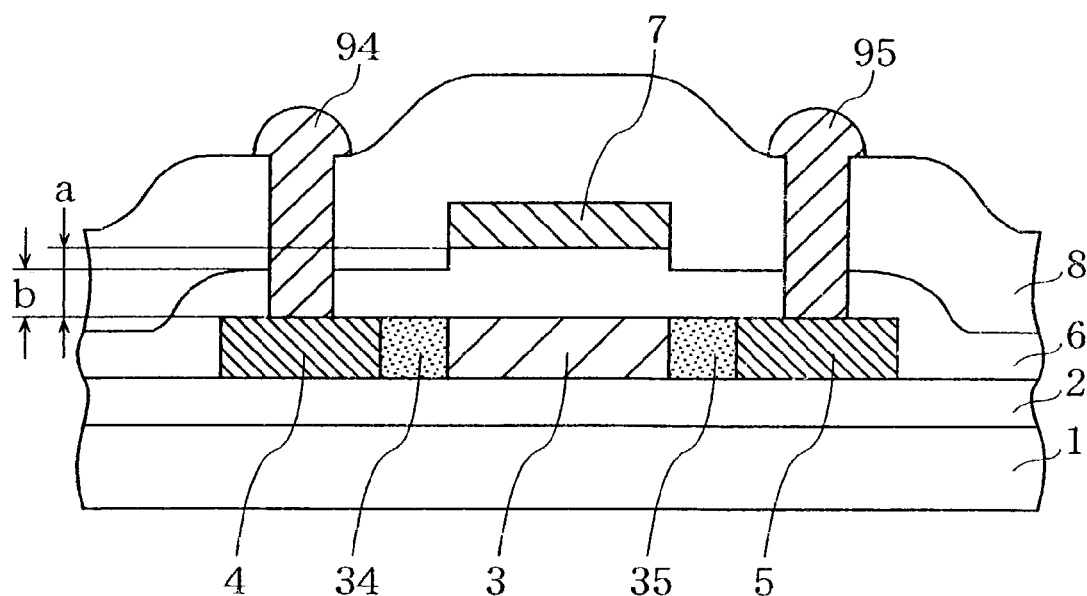
FIG. 3 is a cross-sectional view of a thin film transistor of Embodiment 1 of the present invention.

The present embodiment relates to a thin film transistor itself A cross-sectional view of a thin film transistor of the present embodiment is shown in FIG. 3. Hereinafter, this top gated polysilicon thin film transistor will be explained referring to the figure. It is to be noted that the same reference numerals are used in the figure to indicate parts that have the same functions and effects as those shown in FIG. 1.

The thin film transistor shown in the figure is basically identical to the prior art thin film transistor shown in FIG. 1. However, it differs from that of FIG. 1 in that the thickness of a portion of the gate insulating film 6 that is directly below a gate line layer 7 is made larger than that of the rest of the gate insulating film.

A manufacturing process of the thin film transistor shown in FIG. 3 is sequentially depicted in FIG. 4. The manufacturing process shown in the figure is basically the same as that shown in FIG. 2. However, the formation and processing of their respective gate insulating films shown in (2) are different. Hereinafter, only the differences will be explained.

(2) A gate insulating film 6 of $SiO_2$ is formed into a thickness of 100 nm so as to cover the upper surface of the polysilicon film, and a metal film that forms a gate line layer is then formed into a thickness of 250 nm over the gate insulating film. Subsequently, when or after the metal film is patterned into the gate line layer 7, the $SiO_2$ gate insulating film is partly removed by a thickness of 3 nm by etching. In this stage, the gate line layer serves as an etching mask or an etch stopper, so the thickness of the portion of the $SiO_2$ gate insulating film that is under the gate line layer remains unchanged. Next, doping with phosphorus ions at a low dose ($n^-$doping) is performed so that the polysilicon film, except the region that is directly below the gate line layer 7 (which forms a channel region), has the same impurity concentration as that in the regions of DLL structures.

With regard to the patterning of the gate metal layer, as long as an etching gas is used such that the composition thereof and the ratio of, for example, $SF_6$ and $O_2$ are adjusted so as to be suitable for a metal material such as tantalum (Ta), molybdenum (Mo), tungsten (W), or other metal materials such as MoW, the partial removal of the insulating film is made possible by using the remaining gate line layer as a mask after the patterning of the gate metal has been completed. (In practice, they can be simultaneously performed.)

With the above-described process, a polysicilon thin film transistor, which is a semiconductor device of the present embodiment, is completed.

Occurrence of microcracks in the gate insulating film is now discussed where the thickness of a region of the gate insulating film that is directly under the gate line layer is a nm and that of the rest of the gate insulating film is b nm, the thickness of the region that is directly under the gate line layer is, in the present embodiment, larger than that of the rest of the gate insulating film by (a–b=) 3 nm. This is a significant factor contributing to the prevention of the occurrence of microcracks. The reason for this will be explained below.

Figure 5:
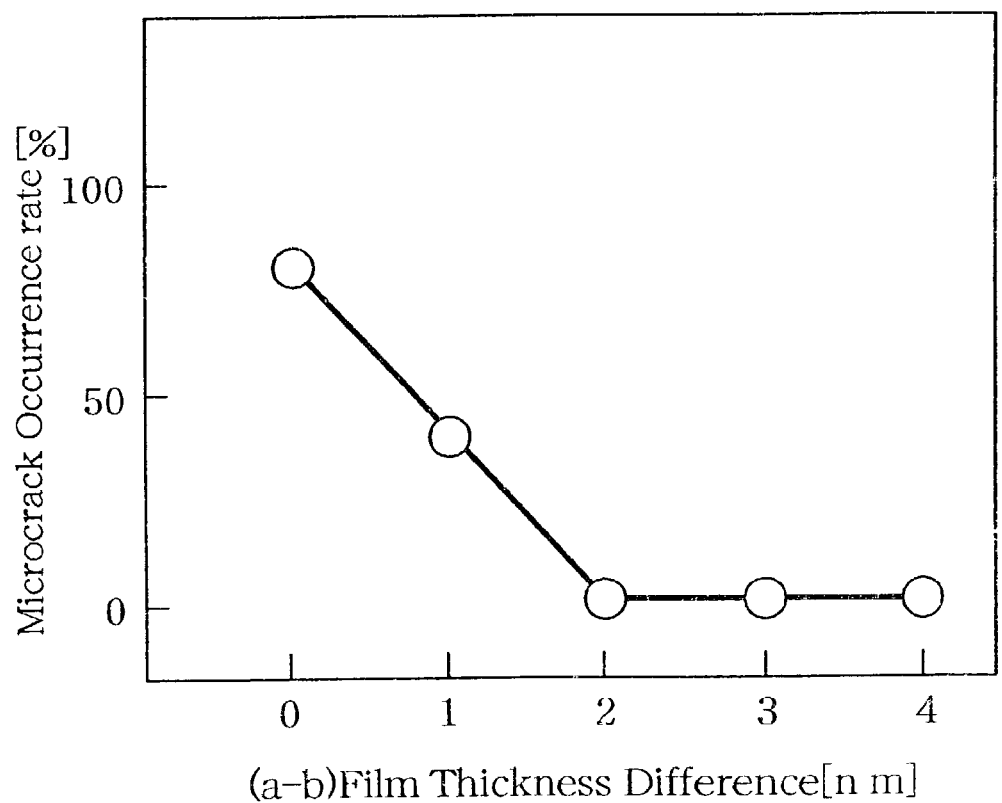
FIG. 5 is a graph showing the relationship of the film thickness difference of the gate insulating film between the region of the gate insulating film directly below the gate line layer and the other regions with the microcrack occurrence rate.

FIG. 5 is a graph showing the relationship of film thickness difference (a–b) and microcrack occurrence rate in a case where a large size, 320 mm×400 mm substrate is employed. As indicated in the graph, the microcracks are generated at a rate of about 80% when the film thickness difference (a–b) is 0 nm, but the rate falls to almost 0% when the film thickness difference (a–b) exceeds 2 nm; the occurrence of microcracks remarkably decreases when the film thickness difference (a–b) is large.

In the graph, even when there is only one micorcrack occurring in a large substrate, it is regarded as an occurrence of microcracks.

Embodiment 2

The present embodiment relates to a substrate.

Figure 6:
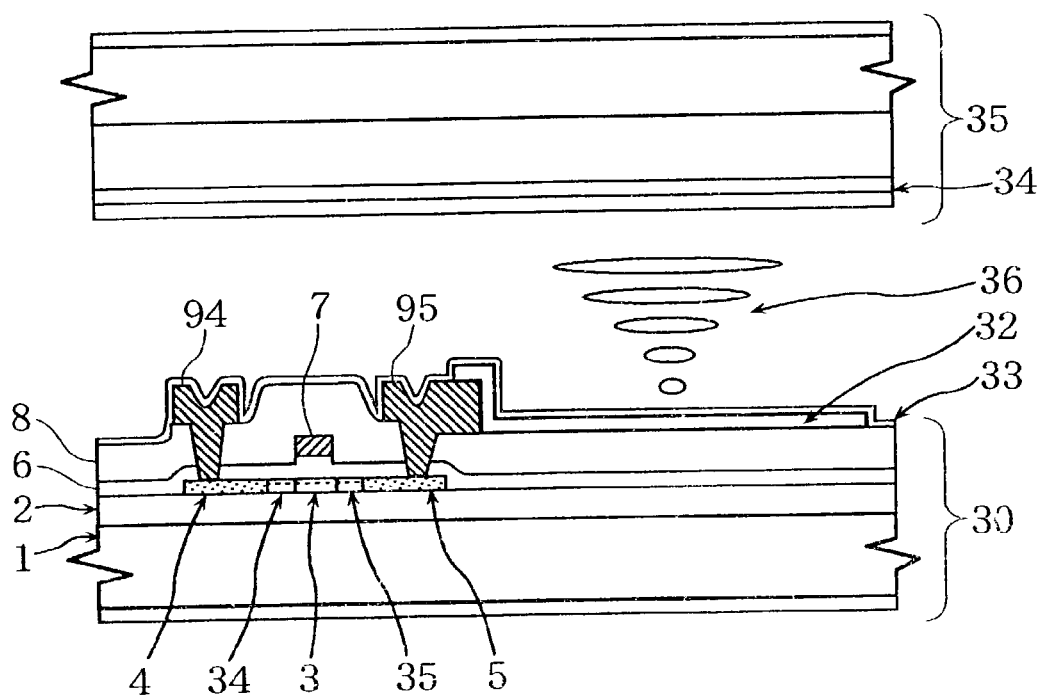
FIG. 6 is a cross-sectional view showing a liquid crystal display device of Embodiment 2 of the present invention.

FIG. 6 is a cross-sectional view of substrates of a liquid crystal display device, one of which has the top gated polysilicon thin film transistor of the previous embodiment formed thereon.

In FIG. 6, reference numeral 35 denotes an upper substrate and reference numeral 34 a counter electrode. Reference numeral 30 denotes an upper substrate, reference numeral 33 a passivation film, and reference numeral 32 a pixel electrode. Reference numeral denotes 36 a liquid crystal layer. The other reference numerals denote the same components as those in FIG. 3 and so forth.

In the present embodiment, only a portion of the insulating film for the gate electrode portion is subjected to two-step processing in advance so as to be thick.

Embodiment 3

The present embodiment relates to a substrate.

Figure 7:
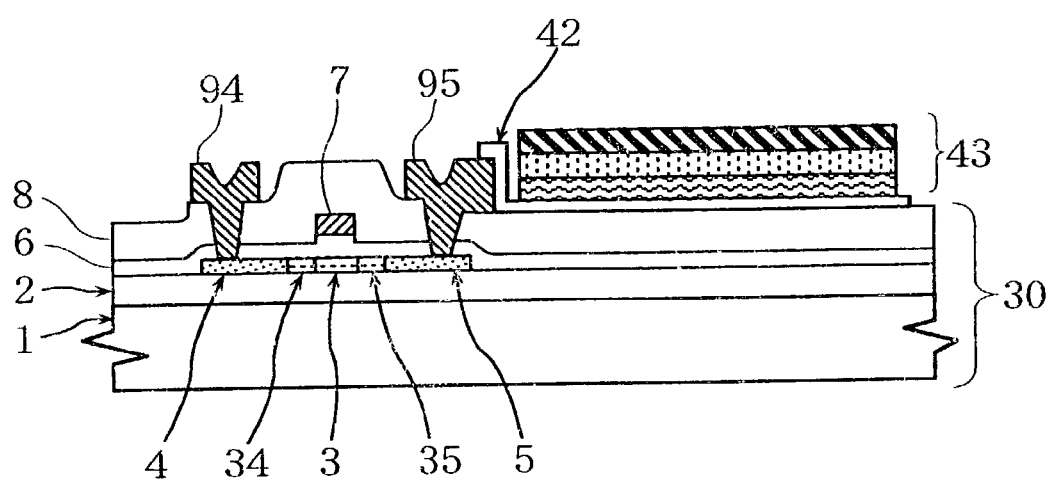
FIG. 7 is a cross-sectional view showing an EL display device of Embodiment 3 of the present invention.

FIG. 7 is a cross-sectional view showing the substrate structure of an EL display device having the top gated polysilicon thin film transistor of the previous embodiment formed thereon.

Figure 2:
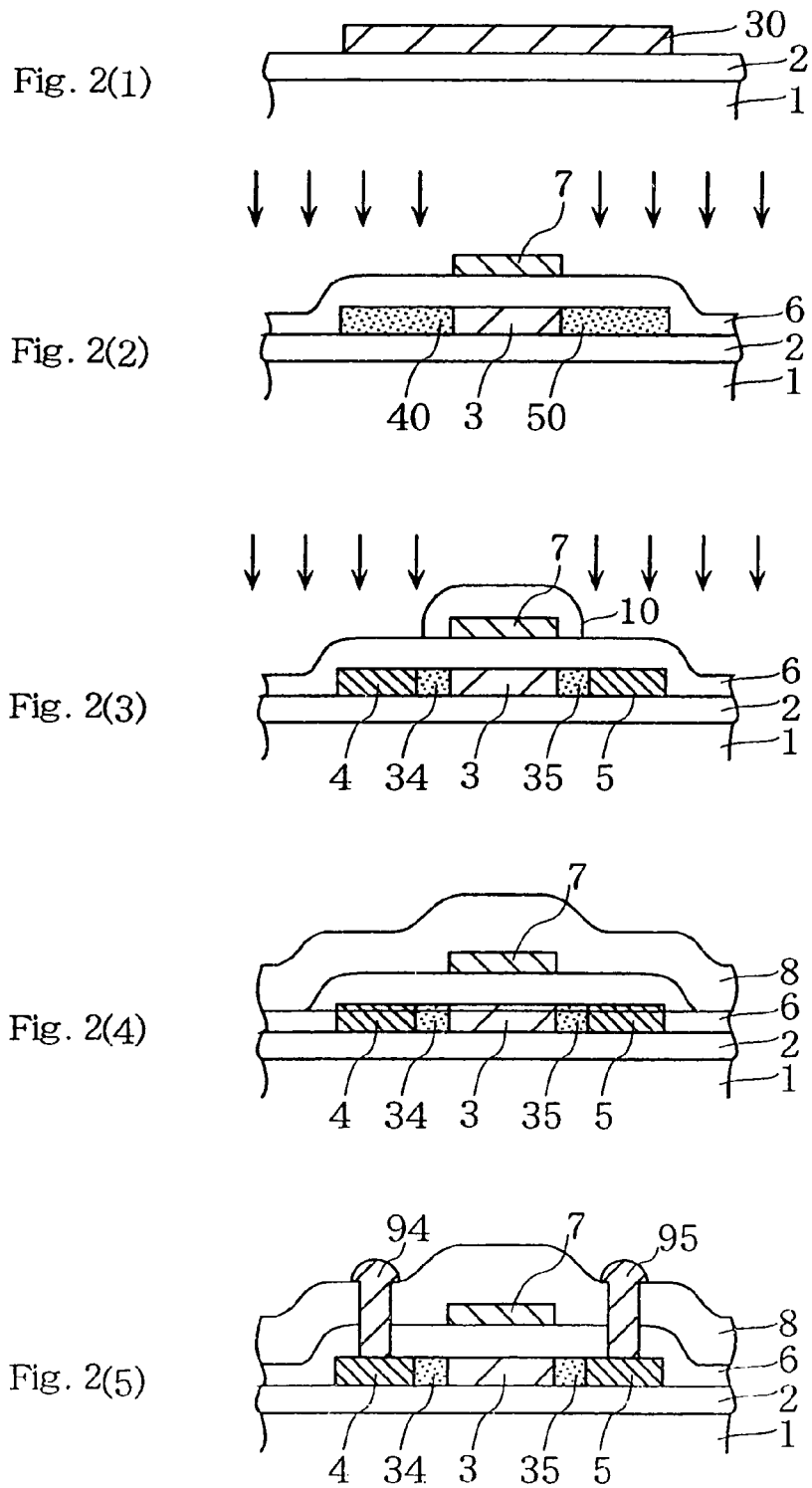
FIG. 2 is a view showing a manufacturing process of the above-mentioned thin film transistor.

The structure of an EL display device of the present embodiment and a manufacturing method thereof will be described with reference to FIG. 7 First, a thin film transistor is formed on a glass substrate 1 according to the process that has been explained referring to FIG. 2. Subsequently, an extraction electrode 42 is formed so as to be connected to a drain-side electrode of a transistor in the pixel region, and a thin film transistor array is completed. Next, a light-emitting material 43 is deposited on the extraction electrode 42, and the EL display device is completed.

As is obvious from FIG. 7, in the thin film transistor formed on the glass substrate, the thickness of the gate insulating film is made large in a portion thereof that is directly under the gate line layer. As a result, it becomes possible to construct a large-sized EL display device while occurrence of microcracks is prevented.

Embodiment 4

The present embodiment relates to a bottom gated thin film transistor.

Figure 8:
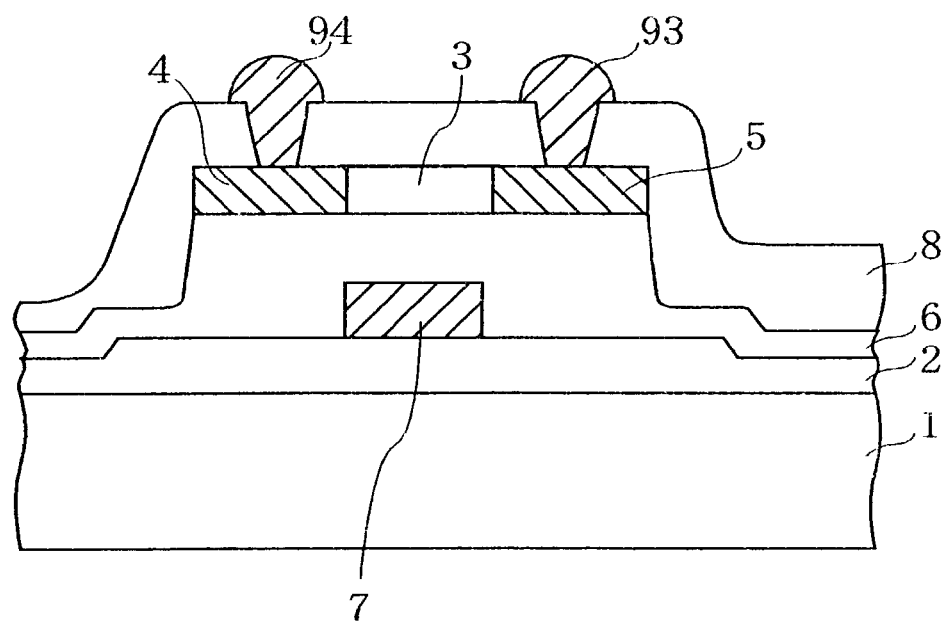
FIG. 8 is a cross-sectional view of a bottom gated thin film transistor of Embodiment 4 of the present invention.

As is seen in FIG. 8, the thickness of the gate insulating film is made larger than that of the rest of the gate insulating film only in a portion of a gate insulating film that is directly under a semiconductor layer 3.

In addition, the thickness of an underlying insulating film 2 is made an ordinary thickness only in a portion thereof that is in the vicinity of the semiconductor layer.

Embodiment 5

The present embodiment relates to an underlying insulating film.

Figure 9:
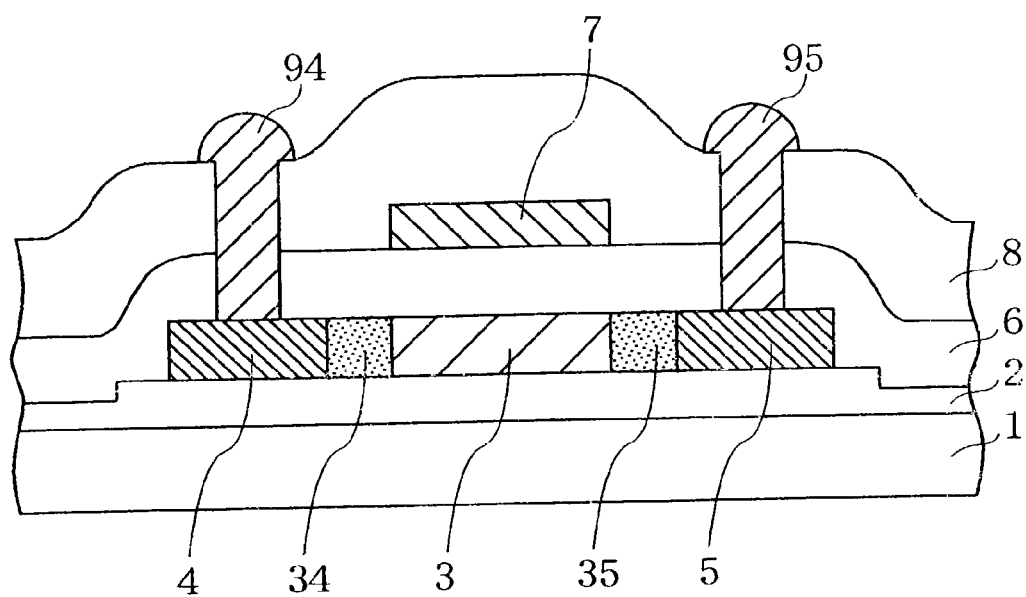
FIG. 9 is a cross-sectional view showing a thin film transistor of Embodiment 5 of the present invention.
Figure 10:
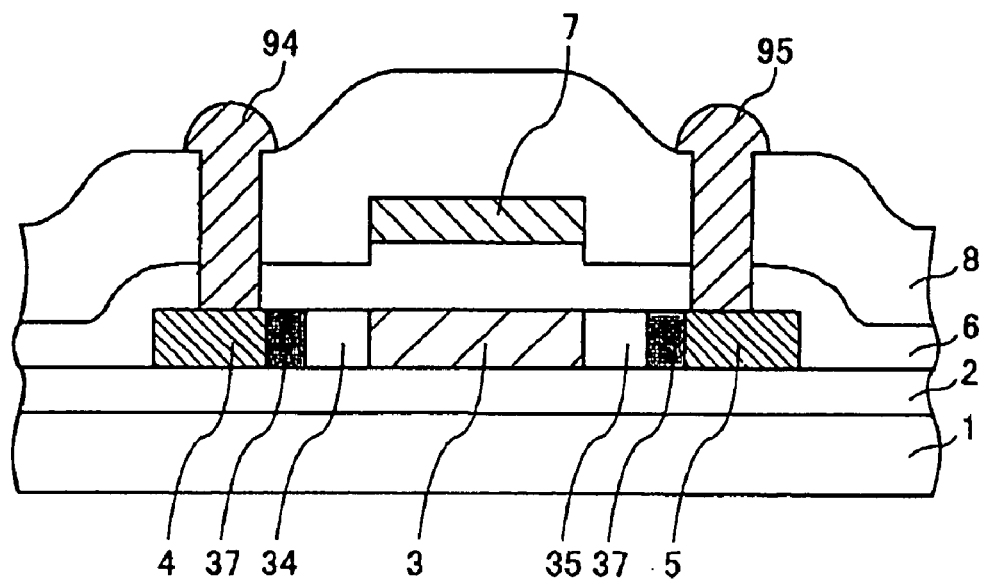
FIG. 10 is a cross-sectional view showing a thin film transistor of another embodiment of the present invention.

As is seen in FIG. 9, the thickness of the underlying gate insulating film 2 is made larger only in a portion thereof that is directly under the semiconductor layer 3 and a portion thereof that extends off the semiconductor layer by 2 μm than that of the rest of the underlying gate insulating film.

Although the present invention has been explained above with reference to the preferred embodiments thereof, it will be apparent that the present invention is not limited thereto. That is, the present invention may be, for instance, as follows.

(1) In embodying the present invention, various optimum values may be selected for all of the film thickness of the $SiO_2$ layer, the film thickness difference in portions, and the like in accordance with the shape and size of the glass substrate and the nature of each manufacturing process.

(2) The semiconductor layer need not be a polysilicon film but may comprise monocrystal silicon, amorphous silicon, or other semiconductor compounds such as GaAs, SiGe, SiGeC, or the like.

(3) The gate insulating film need not be a single layer of a $SiO_2$ film and may comprise a SiN film or a multilayer film including a $SiO_2$ film and a SiN film. Furthermore, the composition may differ from that described in the claims on account of the manufacturing.

(4) The liquid crystal device may function as a light shutter or a light logic device.

(5) The differences in the insulating film are not limited to the steps as shown in FIG. 4(2) but have curved-surface like shapes.

(6) The LDD regions and offset regions 37 may or may not be provided, depending on the dimensions of the substrates and the elements, the material of the elements, and the like.

INDUSTRIAL APPLICABILITY

As is apparent from the above description, according to the present invention, particularly in a large-sized array substrate having top gated thin film transistors formed thereon, it is possible to control occurrence of microcracks, for example, by making the thickness of a region of the gate insulating film that is directly under the gate line layer larger than that of the rest of the gate insulating film and to control warpage in the substrate. This enables the device using a liquid crystal be stable and improves the reliability of the manufacturing process.

What is claimed is:

1. A substrate for use in a liquid crystal device comprising a plurality of thin film transistors, each thin film transistor comprising:
    a semiconductor layer having a channel region, a source region, and a drain region, each region being separate from the other regions, a gate insulating film covering the upper surface of the semiconductor layer, and a gate electrode located on the gate insulating film and above the channel region of the semiconductor layer, and a gate line layer comprising the gate electrode and a line for transmitting a signal to the gate electrode, wherein:
    the gate insulating film comprises a first area having a first film thickness and located only under and not beyond the entire gate line layer and a second area having a second film thickness and located on the substrate including the upper surface of the semiconductor layer that is other than the first area, said first thickness being thicker than said second thickness.

2. The substrate for use in a liquid crystal device according to claim 1, wherein the first area is a predetermined thickness-increased area such that the thickness of the gate insulating film is 1.5–4 nm larger than that of the second area.

3. A substrate for use in a liquid crystal device comprising a plurality of thin film transistors, each thin film transistor comprising:
    a semiconductor layer having a channel region, LDD regions located on opposing sides of the channel region, a source region, and a drain region, each region being separate from the other regions, a gate insulating film covering the upper surface of the semiconductor layer, and a gate electrode located on the gate insulating film and above the channel region of the semiconductor layer, and a gate line layer comprising the gate electrode and a line for transmitting a signal to the gate electrode, wherein:
    the gate insulating film comprises a first area having a first film thickness and located only under and not beyond the entire gate line layer and a second area having a second film thickness and located on the substrate including the upper surface of the semiconductor layer other than the first area, said first thickness being thicker than said second thickness.

4. A substrate for use in a liquid crystal device comprising a plurality of thin film transistors, each thin film transistor comprising:
    a semiconductor layer having a channel region, offset region regions located on opposing sides of the channel region, a source region, and a drain region, each region being separate from the other regions, a gate insulating film covering the upper surface of the semiconductor layer, and a gate electrode located on the gate insulating film and above the channel region of the semiconductor layer, and a gate line layer comprising the gate electrode and a line for transmitting a signal to the gate electrode, wherein:
    the gate insulating film comprises a first area having a first film thickness and located only under and not beyond the entire gate line layer and a second area having a second film thickness and located on the substrate including the upper surface of the semiconductor layer other than the first area, said first thickness being thicker than said second thickness.

5. A liquid crystal device comprising a plurality of thin film transistors used for switching elements, each thin film transistor comprising:
    a substrate having located thereon, a semiconductor layer having a channel region, a source region, and a drain region, a gate insulating film located over the entire substrate including the upper surface of the semiconductor layer, a gate line layer located on the gate insulating film and above the channel region, wherein the gate insulating film comprises a first area having a first film thickness and located only under and not beyond the entire gate line layer and a second area having a second film thickness and located above the semiconductor layer other than the first area, said first thickness being thicker than said second thickness.

6. The liquid crystal device according to claim 5, wherein the thin film transistor is a switching element comprising a predetermined gate insulating film thickness-increased type thin film transistor wherein the first area of the gate insulating film is at least 1.5 nm thicker than the second area.

7. The liquid crystal device according to claim 6, wherein the thin film transistor is a switching element comprising a silicon dioxide thin film transistor wherein the gate insulating film comprises silicon dioxide.

8. The liquid crystal device according to claim 5, wherein the thin film transistor is a switching element comprising a silicon dioxide thin film transistor of silicon dioxide such that the gate insulating film contains silicon dioxide.

9. A liquid crystal device comprising a plurality of thin film transistors used for switching elements, each thin film transistor comprising:
a substrate having located thereon, a semiconductor layer having a channel region, LDD regions located on opposing sides of the channel region, a source region, and a drain region, each region being separate from the other regions, a gate insulating film located over the entire substrate including the upper surface of the semiconductor layer, a gate line layer located on the gate insulating film and above the channel region, wherein the gate insulating film comprises a first area having a first film thickness and located only under and not beyond the entire gate line layer and a second area having a second film thickness and located above the semiconductor layer that is other than the first area, said first thickness being thicker than said second thickness.

10. A substrate for use in a liquid crystal device comprising a plurality of thin film transistors, each thin film transistor comprising:
a substrate having located thereon, a semiconductor layer having a channel region, a source region, and a drain region, each region being separate from the other regions, a gate insulating film located to cover the upper surface of the semiconductor layer, and a gate electrode located on the gate insulating film and above the channel region of the semiconductor layer, and a gate line layer comprising the gate electrode and a line for transmitting a signal to the gate electrode, wherein:
the gate insulating film comprises a first area having a first film thickness and located only under and not beyond the entire gate line layer and a second area having a second film thickness and located over the entire substrate including the upper surface of the semiconductor layer other than the first area, said first thickness being thicker than said second thickness.

11. The substrate for use in a liquid crystal device according to claim 10, wherein the first area is a predetermined thickness-increased area such that the gate insulating film is 1.5–4 nm thicker than the second area.

12. A substrate for use in a liquid crystal device comprising a plurality of thin film transistors, each thin film transistor comprising:
a substrate having located thereon, a semiconductor layer having a channel region, LDD regions located on opposing sides of the channel region, a source region, and a drain region, each region being separate from the other regions, a gate insulating film covering the upper surface of the semiconductor layer, and a gate electrode located on the gate insulating film and above the channel region of the semiconductor layer, and a gate line layer comprising the gate electrode and a line for transmitting a signal to the gate electrode, wherein:
the gate insulating film comprises a first area having a first film thickness and located only under and not beyond the entire gate line layer and a second area having a second film thickness and located over the entire substrate including the upper surface of the semiconductor layer other than the first area, said first thickness being thicker than said second thickness.

* * * * *

UNITED STATES PATENT AND TRADEMARK OFFICE
CERTIFICATE OF CORRECTION

| | | |
|---|---|---|
| PATENT NO. | : 6,974,972 B1 | Page 1 of 1 |
| APPLICATION NO. | : 10/111005 | |
| DATED | : December 13, 2005 | |
| INVENTOR(S) | : Hironori Tanaka et al. | |

It is certified that error appears in the above-identified patent and that said Letters Patent is hereby corrected as shown below:

In the title page, item (56), line 3 under FOREIGN PATENT DOCUMENTS, the third-listed reference should read:

-- JP           03-020046           1/1991 --

In claim 4, column 8, line 32, delete "region".

Signed and Sealed this

Twenty-second Day of August, 2006

JON W. DUDAS
*Director of the United States Patent and Trademark Office*